Dec. 24, 1957 M. B. FREEDMAN 2,817,716

GAIN CONTROL CIRCUITS

Filed March 5, 1954

INVENTOR.
MELVIN B. FREEDMAN
BY
G. D. O'Brien
T. L. Styner
ATTYS.

United States Patent Office 2,817,716

Patented Dec. 24, 1957

2,817,716

GAIN CONTROL CIRCUITS

Melvin B. Freedman, Roxbury, Mass., assignor, by mesne assignments, to the United States of America as represented by the Secretary of the Navy Application March 5, 1954, Serial No. 414,526

5 Claims. (Cl. 179—171)

My invention relates to gain control circuits for amplifiers, and is particularly directed to gain controls for amplifier systems that must be isolated from noise voltages which may appear in the electrical ground or ground structures supporting the systems.

High frequency amplifier systems are always vulnerable to unwanted noise voltages. The usual point of entry of noise voltages into such systems as video transmission lines is at the repeater or amplifier stations where amplifier tubes and their appurtenant power supply and gain control circuits must be physically mounted on and electrically connected to grounded structures. Solid zero-resistance grounding connections are the accepted means for reducing noise, but unfortunately noise voltage sources may produce potentials between grounded points and introduce currents into the signal circuits through the very ground connections intended to eliminate the noise.

An object of my invention is an improved amplifier the input electrodes of which are effectively isolated from all voltages except the signal voltage to be amplified.

A more specific object of my invention is an improved amplifier with gain control, the input electrodes of which may receive not only signal voltage but direct current gain control voltages without establishing coupling between ground and either input electrode.

Other objects and features of my invention will become apparent from the following description of one embodiment of the invention. The invention is defined with particularity in the appended claims and is illustrated in the accompanying drawing in which:

Figure 1:
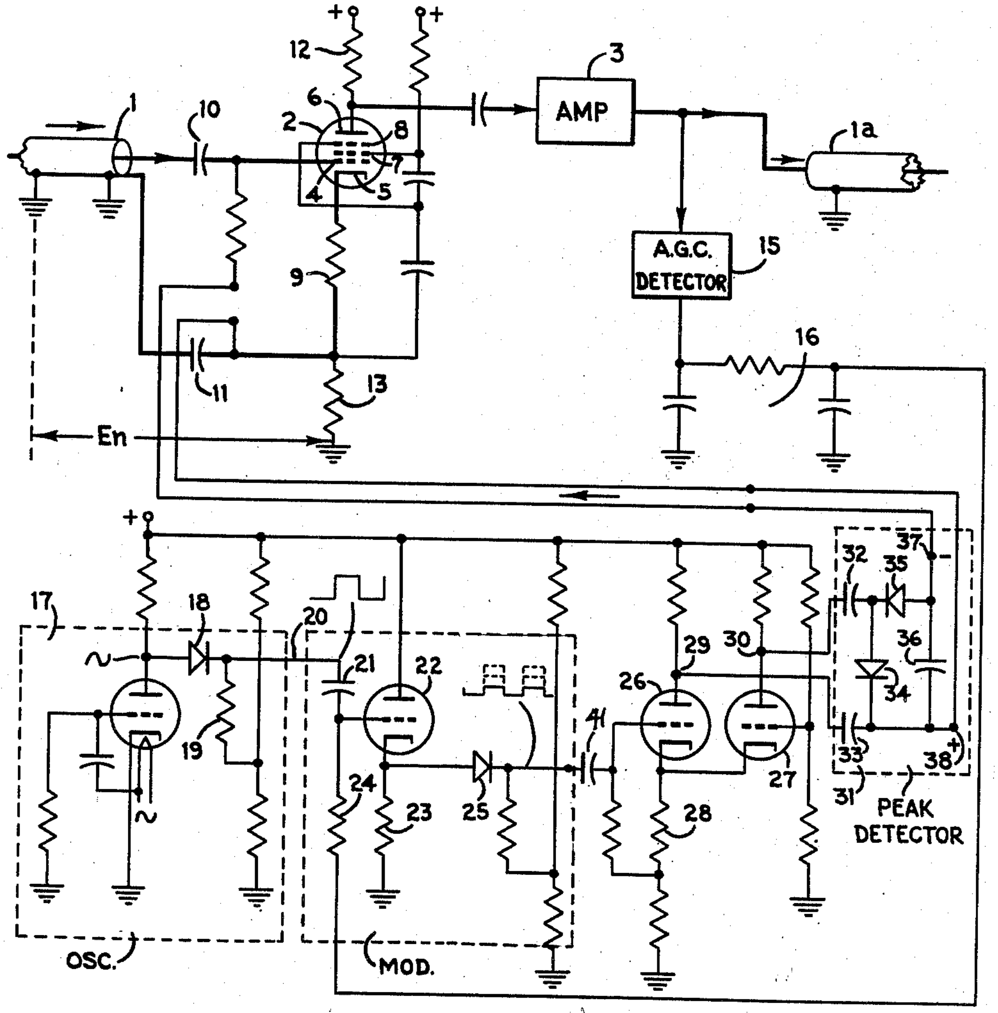
Figure 1 is a circuit diagram of said one embodiment.

Let it be assumed an amplifier must be interposed in a high frequency transmission circuit, comprising for example, a coaxial cable 1—1*a*, and that the amplified level of the outgoing signal voltage at 1*a* must be maintained between relatively narrow limits. One stage of the amplifier is shown at 2, additional stages 3 being included if desired. Amplifier 2 has input electrodes comprising control grid 4 and cathode 5, and has output anode electrode 6. For high frequency amplification a pentode is preferred with screen grid 7 held at or near anode potential, and suppressor grid 8 connected to the cathode. Included in the input circuit of the amplifier is the cathode resistor 9 for biasing the control grid. The incoming transmission line is coupled, through coupling condensers, 10 and 11, to the control grid and to the end of the cathode resistor remote from the cathode. The output of the amplifier is made at the anode end of the load resistor 12. Now, according to one feature of my invention, the entire amplifier is isolated from ground by a grounding resistor 13 of relatively high ohmic value. Resistor 13 may thus complete the anode circuit of the amplifier while at the same time attenuates the flow of spurious currents induced by noise voltage $E_n$ that may appear between the grounded end of the resistor 13 and more remote grounded points. It is to be noted that such noise currents which do flow through the grounding resistor 13 do not produce grid-to-cathode voltages. The impedance of coupling condenser 11 should be kept low.

According to an important feature of my invention, a direct current voltage may be applied between the control grid 4 and cathode 5, as for modulation purposes or automatic gain control, without establishing a low impedance path to the grid for the noise currents. In the particular system shown in Fig. 1, the output signal voltage level is sampled by an automatic gain control detector 15 of any conventional construction and the detected signal is smoothed as by the filter 16.

Now, an oscillation generator 17 is provided to generate an alternating wave, the simpler types of generator usually generating a more or less sinusoidal wave. To convert the generating wave to a square wave form, for reasons which will soon appear, a rectifier 18 is connected between the anode of the oscillator and a biasing source through resistor 19 to clip, cut off, or flatten the loops of the wave to make them substantially flat-topped or rectangular. If the biasing potential on one side of rectifier 18 is only slightly less than the voltage of the anode source, only the base portions of the loops of the oscillator waves will appear at the output 20 of the rectifier.

The square wave output is applied through coupling condenser 21 to the grid of a modulator tube such as the triode 22. The amplified square waves at the output of triode 22 may now be made proportional to a direct current bias applied to the gride of the triode 22. The bias of the grid of the triode 22 is obtained through the coupling resistor 24 from the filtered output of the automatic gain control detector 15 and its smoothing circuit 16. The direct current potential at the cathode of tube 22 will follow very nearly volt-for-volt the changes in bias introduced by detector 15. Since one end of rectifier 25 is connected to this cathode point and the other end is returned to a relatively fixed potential more or less positive with respect to its own anode, the amplitude of the locally generated oscillation will be limited in transit through rectifier 25 in accordance with the bias applied to tube 22 grid circuit, and hence in accordance with the peak magnitude of signal developed by amplifier 3.

The rectilinear wave form is next applied through coupling condenser 41 to the grid circuit of a push-pull amplifier, the two output terminals 29 and 30 of which are isolated from ground and are connected, respectively, to the two input terminals of the peak detector 31. The push-pull amplifier of Fig. 1 comprises, for example, two triodes 26 and 27, one being connected as a cathode-follower to the other. Since the cathode of triode 27 is connected to the upper end of the coupling cathode resistor 28 of triode 26, the space current through triode 27 will vary in phase opposition to the variations in space currents of triode 26. This means that the potentials at 29 and 30 at the anode ends of the load resistors vary in opposite directions as the modulated square wave is applied.

Peak detector 31 comprises a system of rectifiers which insures very high impedance between the two output terminals 37 and 38 of the detector. Coupling condensers 32 and 33 apply the variable amplitude square wave across rectifier 34. The output terminals of the detector are connected across rectifier 34 and preferably through a second rectifier 35 and in parallel to smoothing condenser 36. It will be perceived that the output terminals 37 and 38 of the peak detector are both completely galvanically removed from ground and that the input electrodes 4 and 5 of the signal amplifier 2 may be connected thereto without establishing a path to ground for either input electrode. Hence, according to my invention biasing potentials may be applied to the signal amplifier 2 from either an automatic gain control detector or from any modulating source without introducing into the input of the signal amplifier the troublesome ground noise voltages $E_n$ which invariably are present in such systems.

Figure 2:
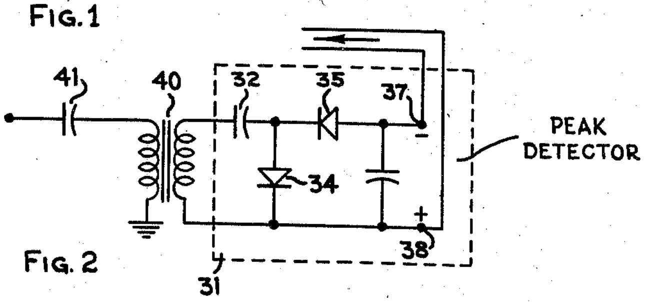
Figure 2 is a circuit diagram of alternative connections immediately adjacent the condenser 41 of Figure 1.

Alternatively, the isolating circuit may comprise a transformer 40 as shown in Fig. 2. One end of the primary of the transformer is coupled through coupling condenser 41 (Fig. 1) to the modulated square wave output of modulator 22, and the other end of the primary connected as desired directly to ground. The secondary of the coupling transformer however is connected only to the input terminals of the peak detector 31. Here again the output terminals 37 and 38 of the peak detector are isolated from ground and from each other by very high impedance paths. Accordingly, the output terminals of the peak detector may be connected directly to the input circuit of a signal amplifier 2 without introducing noise voltages into that amplifier.

Many modifications may be made in the details of the exemplified circuitry here disclosed without departing from the scope of my invention as defined in the appended claims. The specific type of oscillator shown or its squaring circuitry may be extensively modified by those skilled in the art. If linearity is not required between the controlled and controlling voltages for the bias of the signal amplifier, the squaring elements may in fact be omitted. Further, the controlling voltages may be derived from any source and are obviously not necessarily limited to the output of the automatic gain control 15.

I claim:

1. In an amplifier system; an amplifier tube having a grid and cathode, and an output electrode; a signal transmission circuit coupled by low impedance coupling means to said grid and cathode, said grid and cathode being grounded through a high impedance coupling from cathode to ground effectively isolating them from ground and from all noise voltages; an automatic gain control circuit for said amplifier comprising means for sampling the level of the amplified output of the amplifier; an oscillation generator; means coupled to said automatic gain control circuit and to the output of said generator responsive to said amplified output to modulate the output amplitude of said generator; means non-galvanically coupled to said generator for generating two phase-opposed voltages isolated from ground; and connections applying said voltages respectively to said grid and cathode.

2. In combination in a high frequency amplifier; a tube with a pair of input electrodes and an output electrode; a signal circuit coupled by low impedance coupling means to said input electrodes, one of said input electrodes being grounded through a high impedance coupling and the other input electrode being above ground potential effectively isolating said input electrodes from ground and noise voltages; an alternating current voltage source; modulator means coupling said alternating current voltage source for modulating the alternating voltage; means for biasing said modulator means; and direct current biasing means coupled between said modulator means and said input electrodes isolated from ground for applying a direct current bias on said input electrodes in accordance with the bias on said modulator.

3. The combination as set forth in claim 2 wherein said means for biasing said modulator means is an automatic gain control network coupled to said tube output electrode for sampling the level of the amplified output of the amplifier and applying the output level as a bias to said modulator means, and said direct current biasing means includes a non-galvanically coupled network producing two phase-opposed voltages coupled non-galvanically separately to a pair of rectifiers, the output of each rectifier providing said coupling to each of said tube input electrodes for applying a bias voltage removed from ground across said input electrodes in accordance with the bias voltage from said automatic gain control network applied to said modulator means.

4. The combination as set forth in claim 2 wherein said input electrodes are the cathode and grid and said output electrode is the anode of said tube; said means for biasing said modulator means is an automatic gain control network coupled to said anode for sampling the level of the amplified output of the amplifier and applying this output level as a bias to said modulator means; and said direct current biasing means includes a pair of cathode coupled triode tubes with the grid of the first coupled to the output of said modulator means and the grid of the second connected through a high impedance to ground for producing two phase-opposed voltages isolated from ground, and includes a pair of rectifiers capacitively coupled separately, one to each anode of said triode pair, the output of each rectifier providing said coupling to each said grid and cathode of said amplifier for applying a bias voltage across said grid and cathode in accordance with the bias voltage from said automatic gain control network applied to said modulator means in a manner isolated from all ground potentials.

5. The combination as set forth in claim 2 wherein said input electrodes are the grid and cathode and said output electrode is the anode of said tube; said means for biasing said modulator means is an automatic gain control network coupled to said tube anode for sampling the level of the amplified output of the amplifier and applying this output level as a bias to said modulator means; and said direct current biasing means includes a transformer non-galvanically coupling said modulator means to a pair of rectifiers producing two direct current voltages, one each being applied, by said coupling of said direct current biasing means to said tube input electrodes, respectively, galvanically to one each of said grid and cathode for applying a direct current bias across said grid and cathode removed from ground in accordance with the bias voltage established on said modulator means by said automatic gain control network.

References Cited in the file of this patent

UNITED STATES PATENTS

| | | |
|---|---|---|
| 1,907,741 | Cloud | May 9, 1933 |
| 2,158,248 | Numans | May 16, 1939 |
| 2,214,608 | Bull | Sept. 10, 1940 |
| 2,279,128 | Paslay | Apr. 7, 1942 |
| 2,528,206 | Beveridge | Oct. 31, 1950 |
| 2,554,132 | Van Zelst | May 27, 1951 |
| 2,561,047 | Broos | July 17, 1951 |
| 2,623,954 | Van Zelst | Dec. 30, 1952 |
| 2,623,996 | Gray | Dec. 30, 1952 |